United States Patent [19]

Chikatsu

[11] 4,085,431
[45] Apr. 18, 1978

[54] LIMITER CIRCUIT

[75] Inventor: Masahiro Chikatsu, Tokyo, Japan

[73] Assignee: Sony Corporation, Tokyo, Japan

[21] Appl. No.: 741,122

[22] Filed: Nov. 11, 1976

Related U.S. Application Data

[63] Continuation of Ser. No. 586,600, Jun. 13, 1975, abandoned.

[30] Foreign Application Priority Data

Jun. 20, 1974  Japan ............................. 49-72183[U]

[51] Int. Cl.$^2$ ............................................... H03G 3/30
[52] U.S. Cl. ................................... 361/56; 330/207 P; 361/91
[58] Field of Search ................. 361/56, 91; 330/207 P; 323/8

[56] References Cited

U.S. PATENT DOCUMENTS 3,835,401  9/1974  Tomita et al. ..................... 323/8 X

FOREIGN PATENT DOCUMENTS 1,270,813  4/1972  United Kingdom.

*Primary Examiner*—Harry E. Moose, Jr.
*Attorney, Agent, or Firm*—Lewis H. Eslinger; Alvin Sinderbrand

[57] ABSTRACT

In a limiter circuit, a signal which has its level manually adjusted is supplied to, in turn, a recording amplifier, a signal divider composed of resistors, the base-emitter junction of an emitter follower transistor used as a signal rectifier, and a capacitor connected between the ground and a signal limiting transistor. The emitter follower transistor biased by the signal divider is only made conductive by the signal when the latter is over a predetermined level so that the limiter operation is as free of reducing the dynamic range as is a manual recording operation without the conventional AGC circuit since it acts only for excessively high level pulse-like input signals.

9 Claims, 4 Drawing Figures

LIMITER CIRCUIT

This is a continuation of application Ser. No. 586,600, filed June 13, 1975, now abandoned.

BACKGROUND OF THE INVENTION

1. Field of the Invention

This invention relates generally to a signal recording circuit, and more particularly to a signal limiter circuit for eliminating distortion caused by excessively high level inputs.

2. Description of the Prior Art

In the prior art, when a tape recorder is used for recording a signal, the saturation level of the magnetic tape used therein may give rise to a problem. When the level of an input signal becomes excessively high, the saturation level of the tape may be exceeded with the result that the recording of the input signal is distorted.

For this reason, in the prior art, a so-called AGC circuit, which may adjust or control the gain of an amplifier provided in the recording system in response to the level of an output signal therefrom, is employed so as to make sure that the recording level does not exceed the saturation level.

In this case, however, since the gain of the amplifier is always varied by the AGC circuit in response to the input signal level so as to tend to make the level of the recording signal constant, the dynamic range of the recorded signal is suppressed and hence becomes narrow.

To avoid the above problem associated with the provision of an AGC circuit, a tape recorder has been proposed having a limiter circuit with which, when the input signal level exceeds a reference recording signal level, the input signal to be recorded is limited. In the last mentioned tape recorder, recording is ordinarily carried out in a manner similar to that of manually level-adjust recording, but, when the level of a pulse-like input signal exceeds the reference recording level, the input signal is suppressed or limited, so that the dynamic range for the ordinary recording is as wide as that achieved with manually level-adjusted recording, and the recorded signal is not distorted even if the input signal becomes excessively high.

However, the limiter circuit used in the above mentioned prior art tape recorder is disadvantageous in that it badly affects the signal supplied therefrom to an equalizer circuit and in that it is difficult to select the attack time and recovery time of the limiter circuit.

OBJECTS AND SUMMARY OF THE INVENTION

Accordingly, it is an object of the present invention to provide a limiter circuit which is free of the above noted defects inherent in the prior art circuit.

It is another object of the invention to provide a limiter circuit by which the distortion of a recording signal caused by the excessive high-level pulse-like input signal is eliminated.

It is still another object of the invention to provide a limiter circuit which widens the dynamic range for a signal to be recorded.

It is a further object of the invention to provide a limiter circuit in which only its attack time can be easily changed independently of its attack level and its recovery time.

According to an aspect of the present invention, there is provided a limiter circuit in which the recording level is adjusted manually in advance of a recording amplifier and an emitter-follower transistor is connected through a divider circuit to the output side of the recording amplifier, so that when an excessive high-level pulse-like signal is supplied thereto, the signal divided by the divider circuit is rectified by the base-emitter junction of the transistor, for example, by charging a capacitor connected with the latter and the rectified signal is used to control a limiting transistor. In this case, the attack time and recovery time of the limiting circuit can be suitably selected and the limiting circuit is operated only by an excessively high level pulse input and hence the dynamic range of the limiter circuit can be substantially widened.

The above, and other objects, features and advantages of the invention, will become apparent from the following description taken in conjunction with the accompanying drawings.

DESCRIPTION OF THE PREFERRED EMBODIMENT

For a better understanding of the present invention, a limiter circuit previously proposed for use in a tape recorder will first be described with reference to FIG. 1.

Figure 1:
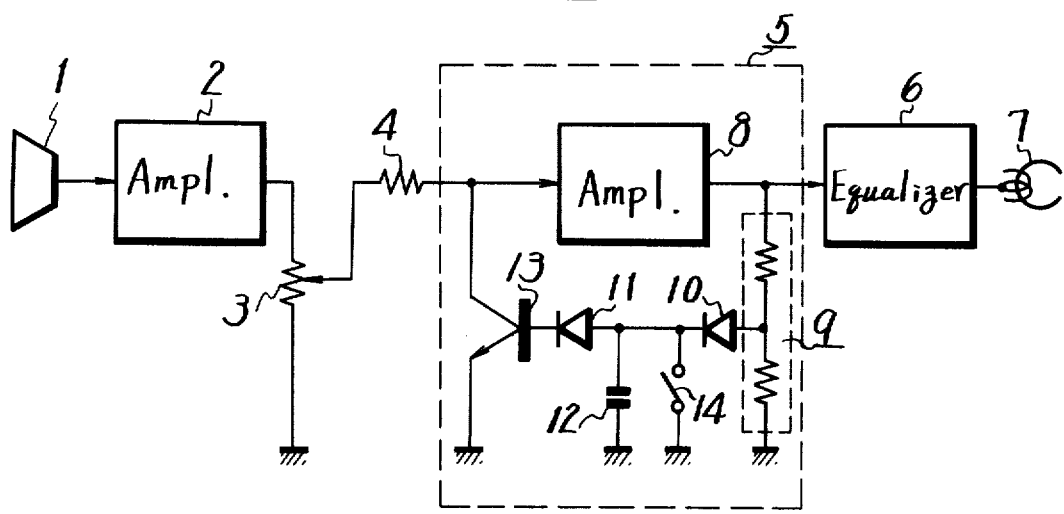
FIG. 1 is a connection diagram showing a limiter circuit previously proposed for use in a tape recorder.

In FIG. 1, reference numeral 1 indicates a microphone whose output signal is supplied through a preamplifier 2 to a variable resistor 3 which is manually adjustable for setting a recording level. An output signal from the variable resistor 3 is applied through a resistor 4 to a limiter circuit 5 whose output signal is supplied through a recording equalizer circuit 6 to a recording magnetic head 7.

As shown in FIG. 1, the previously proposed limiter circuit 5 includes a recording amplifier 8 whose input side is connected to the resistor 4 and whose output signal is supplied to a divider circuit 9 as well as to the equalizer circuit 6. A divided output signal from the divider circuit 9 is supplied to the base of a limiting transistor 13 through a rectifier circuit consisting of diodes 10, 11 and a capacitor 12. The collector of the transistor 13 is connected to the input side of the amplifier 8 and its emitter is grounded. A limiter switch 14 is connected to ground in parallel with the capacitor 12. The operating point of the limiter circuit 5 is determined by the forward voltage drops across the divider circuit 9, diodes 10, 11 and transistor 13, and is set as the reference recording level for a tape (not shown) on which signals are to be recorded by head 7.

When the signal supplied to the magnetic recording head 7 reaches the reference recording level determined by the characteristics of the magnetic tape, the dividing ratio of the divider circuit 9 is such that the input signal to the diode 10 arrives at the threshold voltage thereof to cause the diode 10 to conduct. The diode 11 serves to prevent an excessive negative input pulse from flowing through the base-collector junction of the transistor 13 to the capacitor 12.

When a signal is recorded by the above described tape recorder, the switch 14 is initially closed or turned ON to make the transistor 13 OFF or non-conductive and hence to make the limiter circuit 5 inoperative. With limiter circuit 5 in such state, the variable resistor 3 is adjusted to set the recording level so that the level of an input signal normally does not exceed the reference recording level of the tape. Thereafter, the switch 14 is turned OFF or opened to make the limiter circuit 5 operative and then the recording operation is started.

Accordingly, during ordinary recording, the recording level is set not to exceed the reference recording level by adjusting the variable resistor 3. In this case, since the operating point of the limiter circuit 5 is the reference recording level, the limiter circuit 5 is normally not operated, and accordingly the recording is carried out in a manner similar to that as in the case of ordinary manually level controlled recording.

However, if the variable resistor 3 is not properly set or the input level exceeds the reference recording level, which may occur very seldom, the level of an output signal from the amplifier 8 increases, the potential at the dividing point of the divider circuit 9 rises, and hence the voltage across the capacitor 12 rises. As a result, the impedence value of the transistor 13 is reduced to suppress the input signal to the amplifier 8.

The operation of the above limiter recording system will now be explained with reference to FIG. 2A, in which the ordinate represents the output response and the abscissa represents the microphone input, and also with reference to FIG. 2B, in which the ordinate represents the distortion and the abscissa represents the microphone input.

Figure 2A:
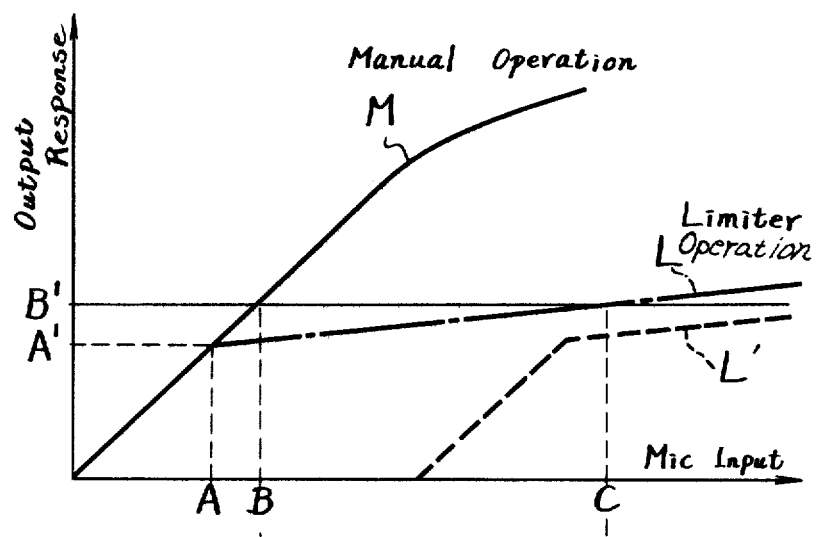
FIGS. 2A and 2B are waveform diagrams to which reference will be made in explaining the operation of the limiter circuit of FIG. 1.
Figure 2B:
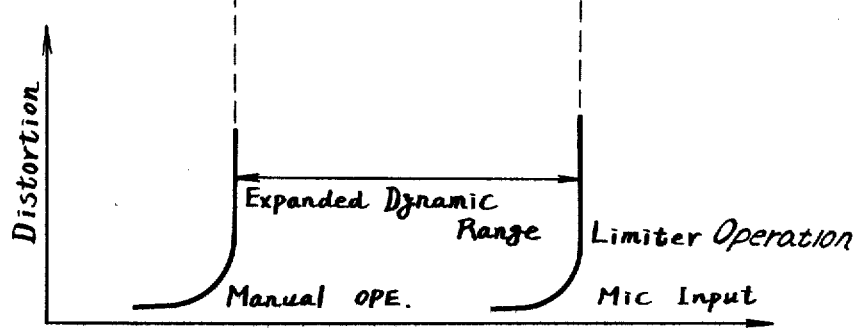

The recording characteristic for ordinary manual operation, that is, with the limiter switch 14 closed to render limiter circuit 5 inoperative, is shown by a curve M in FIG. 2A. If it is assumed that a recording output A' for a recording input A is the reference operating point or level for the tape [at which time, the usual V-U type level meter (not shown) is set at 0 VU] then the output B' for a recording input B may be taken as a maximum output with a tolerable distortion factor the recording amplifier being designed with a distortion factor that is sufficiently lower than that of the tape. Accordingly, in the manual control or operation of the system, if the V-U type level meter is set 0 VU for the recording input A, the recording input B is the critical or maximum tolerable one.

However, if the limiter switch 14 is opened to make the limiter circuit 5 operative the recording characteristic is represented by a curve L in FIG. 2A, which will mean that an input C can be used without exceeding the maximum tolerable output B'. Since the input C is much greater than the input B(C>>B), it can be said that, from equivalent point of view, the dynamic range for the recording input is widened by the difference between the inputs C and B as shown in FIG. 2B. In FIG. 2A, a curve L' represents the characteristic when the variable resistor 3 is set to provide a low recording level.

As may be apparent from the above description, in such a tape recorder it is desired that the rising up time period or attack time of the limiter circuit 5 is short. In fact, the attack time of the limiter circuit 5 shown in FIG. 1 is determined by the divider circuit 9 and the capacitor 12 so that, in order to provide the limiter circuit 5 with a short attack time, the resistance value of the divider circuit 9 and the capacity of the capacitor 12 are required to be small. However, since the divider circuit 9 is connected to the output side of the amplifier 8, if the resistance value of the divider circuit 9 is small, the signal applied to the equalizer circuit 6 is undesirably affected thereby further if the capacity of the capacitor 12 is small, the falling-down time period or recovery time of limiter circuit 5 becomes unnecessarily short, which is also not desired.

An embodiment of this invention which is free of the above defects will be now described with reference to FIG. 3, in which components or elements corresponding to those described above with reference to FIG. 1 are identified by the same reference numerals.

Figure 3:
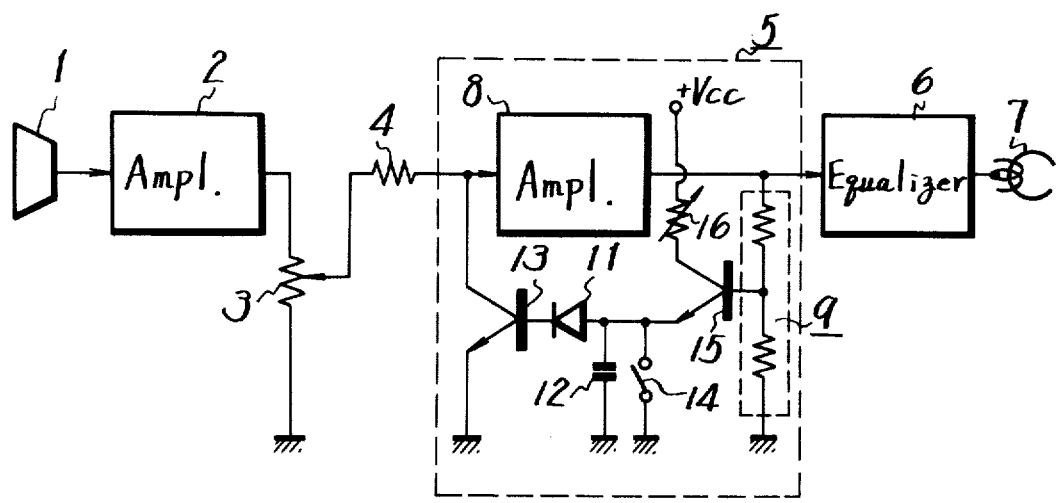
FIG. 3 is a connection diagram showing an embodiment of a limiter circuit for a tape recorder according to an embodiment of the present invention.

As shown in FIG. 3, according to the present invention, an emitter follower transistor 15 is used in place of the diode 10 shown in FIG. 1. The base of the transistor 15 is connected to the dividing point of the divider circuit 9, its collector is connected through a variable resistor 16 to a voltage source of $+V_{cc}$, and its emitter is connected to the anode of the diode 11. Apart from the foregoing, the circuit construction of FIG. 3 is substantially the same as that of FIG. 1.

In the limiter circuit according to the present invention as shown in FIG. 3, the divided output from the divider circuit 9 is rectified by the base-emitter junction of the transistor 15, and hence the limiter operation is carried out in substantially the same way as in the case of the limiter circuit of FIG. 1. However, in the limiter circuit of FIG. 3, since the transistor 15 is connected in an emitter follower configuration, its output impedance is very small, and hence the rising up time period or attack time of the limiter circuit 5 can be made short. In addition, the resistor 16 is connected between the collector of the transistor 15 and the voltage terminal of $+V_{cc}$, so that the time constant determined by the capacitor 12, the transistor 15 and the resistor 16 can be arbitrarily selected. As a result, the rising up time period or attack time of the limiter circuit 5 of FIG. 3 can be determined freely. By way of example, the capacity of the capacitor 12 may be selected to provide the desired falling down time period or recovery time of the limiter circuit 5, and then its rising up time period can be set at its predetermined or desired small value by the resistor 16.

Accordingly, in the limiter circuit according to the invention, if the resistor 16 is made variable, as described above, its resistance may be varied to change only the attack time of the limiter cicuit without varying its attack level, that is, the level at which the impedance of transistor 13 is reduced to limit the level of the input signal to amplifier 8.

Further, in the limiter circuit according to the invention since the input impedance of the transistor 15 is great, the divider circuit 9 can be given a large resistance value. Thus, the signal applied to the equalizer circuit 6 will not be undesirably affected by the connection of divider circuit 9 to its input. Although switch 14 is shown connected parallel with capacitor 12 to ground, the limiter switch 14 may be otherwise connected, for example, to the collector of the transistor 13 or to the base of the transistor 15. However, in such cases the capacitor 12 may not be completely discharged when the limiter circuit 5 is made inoperative, so that the limiter circuit 5 may encounter trouble in operation. However, the connection of switch 14 to ground in parallel with capacitor 12, as shown and preferred, ensures that, when switch 14 is closed to render limiter circuit 5 inoperative, capacitor 12 will be completely discharged.

Having described an illustrative embodiment of the invention with reference to FIG. 3 of the drawings, it is to be understood that the invention is not limited to that precise embodiment, and that various changes and modifications may be effected therein by one skilled in the art without departing from the scope or spirit of the invention as defined in the appended claims.

I claim as my invention:

1. A limiter circuit adapted to be connected between a level regulator and a recording equalizer comprising:
   a. a recording amplifier having an input and an output;
   b. a signal limiting means operative for limiting a signal applied to the input of said amplifier from the level regulator;
   c. signal charging and discharging means comprising a capacitor connected to said signal limiting means for controlling operation of the latter in response to the charging of said signal charging and discharging means;
   d. a high impedance voltage divider connected to the output of said recording amplifier to derive a signal therefrom without affecting the output signal of said recording amplifier;
   e. an emitter-follower transistor for level detecting the output of said recording amplifier and feeding a signal to said signal charging and discharging means for charging the latter when the signal level detected by said transistor exceeds a predetermined level, the base electrode of said transistor being connected to said voltage divider and comprising a high impedance input circuit for said emitter-follower transistor, and an emitter electrode thereof being connected to said signal charging and discharging means and comprising a low impedance charging circuit for said means; and
   f. a variable resistor connected in series with the emitter-collector circuit of said emitter-follower transistor and said signal charging and discharging means to control the charging time of said signal charging and discharging means.

2. A limiter circuit according to claim 1, further comprising a limiter switch for shortcircuiting said signal charging and discharging means, whereby the operation of said signal limiting means is prevented.

3. A limiter circuit according to claim 2, wherein said level regulator is a variable resistor which is manually controlled.

4. A limiter circuit according to claim 3, wherein said signal limiting means is a transistor having a collector, an emitter and a base electrode which are connected to said input of the recording amplifier, the ground and said capacitor, respectively.

5. A limiter circuit according to claim 1, wherein said limiter switch is connected in parallel with said capacitor, and a charge on said capacitor is discharged through said limiter switch when said limiter switch is closed.

6. In a recording circuit including a source of signals to be recorded, a recording amplifier having an input circuit and an output circuit, recording level regulating means interposed between said source of the signals and said input of the recording amplifier, and recording equalizing means connected with said output of said recording amplifier; a limiter circuit associated with said recording amplifier and comprising a high impedance voltage divider connected to the output circuit of said recording amplifier, signal limiting means connected with said input of the recording amplifier and being operative to limit the signals applied to said input from said recording level regulating means, capacitive means adapted to receive an electrical charge for causing operation of said signal limiting means, an emitter-follower transistor comprising a high impedance base-emitter circuit connected to said voltage divider for level detecting the output of said recording amplifier and applying an electrical charge through a low impedance emitter-follower output circuit to said capactive means for operating said signal limiting means when the detected level at said output of the recording amplifier exceeds a predetermined level, and a variable resistor connected in series with the collector-emitter path of said emitter-follower transistor and said capacitive means to determine the attack time of said limiter circuit, the recovery time of said limiter circuit being determined by the capacitance of said capacitive means.

7. A recording circuit according to claim 6; in which said limiter circuit further includes switch means actuable to render said limiter circuit inoperative.

8. A recording circuit according to claim 7 in which said switch means is connected in parallel with said capacitive means to ground for discharging and capacitive means when said switch means is actuated.

9. A recording circuit according to claim 6 in which said signal limiting means includes a transistor having a collector-emitter path connected between said input of the recording amplifier and ground and a base electrode connected to said capacitive means so as to reduce the impedance of said collector-emitter path in response to an electrical charge on said capacitive means.

* * * * *